United States Patent
Park

(10) Patent No.: US 7,029,979 B2
(45) Date of Patent: Apr. 18, 2006

(54) METHODS FOR MANUFACTURING SEMICONDUCTOR DEVICES

(75) Inventor: Cheolsoo Park, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 2 days.

(21) Appl. No.: 10/749,647

(22) Filed: Dec. 30, 2003

(65) Prior Publication Data
US 2004/0152274 A1    Aug. 5, 2004

(30) Foreign Application Priority Data
Dec. 30, 2002    (KR) ...................... 10-2002-0086647

(51) Int. Cl.
*H01L 21/336*    (2006.01)
(52) U.S. Cl. ...................... 438/300; 438/222; 438/226; 438/492
(58) Field of Classification Search ................ 438/222, 438/226, 300, 492, 493, 497, 500
See application file for complete search history.

(56) References Cited

U.S. PATENT DOCUMENTS

| | | | |
|---|---|---|---|
| 5,879,998 A * | 3/1999 | Krivokapic | 438/300 |
| 6,066,881 A * | 5/2000 | Shimizu et al. | 257/392 |
| 6,165,826 A * | 12/2000 | Chau et al. | 438/231 |
| 6,852,559 B1 * | 2/2005 | Kwak et al. | 438/44 |
| 6,872,626 B1 * | 3/2005 | Cheng | 438/299 |

OTHER PUBLICATIONS

Wolf, S. and Tauber, R.N., "Silicon Processing for the VLSI Era", vol. 1, pp. 539-541, 1986.*

* cited by examiner

*Primary Examiner*—Michael Trinh
*Assistant Examiner*—Christy Novacek
(74) *Attorney, Agent, or Firm*—Andrew D. Fortney

(57) ABSTRACT

Methods for manufacturing semiconductor devices are disclosed. In a disclosed method, a first nitride layer and a device isolation oxide layer are etched to thereby expose a portion of a silicon substrate where an active region is to be formed. An epitaxial growth is performed on the active region and a first oxide layer is deposited thereon. Portions of the first oxide layer where a source and a drain are to be formed are etched. The first oxide layer deposited on the portions where the source and the drain are to be formed is then etched. An epitaxial growth is performed on the portions where the source and the drain are to be formed to thereby form the source and the drain. A second nitride layer is deposited thereon. A portion of the first oxide layer located where a gate is to be formed is etched using a gate mask. A third nitride layer is deposited on the source, the drain, and the exposed active region and then etched back to thereby form a nitride layer to control a length of the gate. A gate isolation layer and a gate electrode are sequentially deposited on the active region. A second oxide layer is covered. Finally, a gate electrode plug and a source/drain electrode plug are formed.

6 Claims, 4 Drawing Sheets

METHODS FOR MANUFACTURING SEMICONDUCTOR DEVICES

FIELD OF THE DISCLOSURE

The present disclosure relates generally to semiconductor devices, and more particularly to methods for manufacturing semiconductor devices.

BACKGROUND

As semiconductor devices have become more highly integrated, nano-technology approaches have been developed for manufacturing semiconductor devices.

However, a lithography tool or material are insufficient for mass production and, thus, the size of the diameter of the wafer is enlarged. Also, the purchase cost of the tool and the process cost are excessively increased.

U.S. Pat. No. 5,142,350 describes a method of forming a gate after depositing an epitaxially grown silicon layer and a crystalline boron nitride layer on a substrate.

However, such conventional methods cause structural problems and result in high manufacturing cost for the semiconductor device.

BRIEF DESCRIPTION OF THE DRAWINGS

In the accompanying drawings, like reference numerals appearing in the drawings represent like parts.

DETAILED DESCRIPTION

Figure 1:
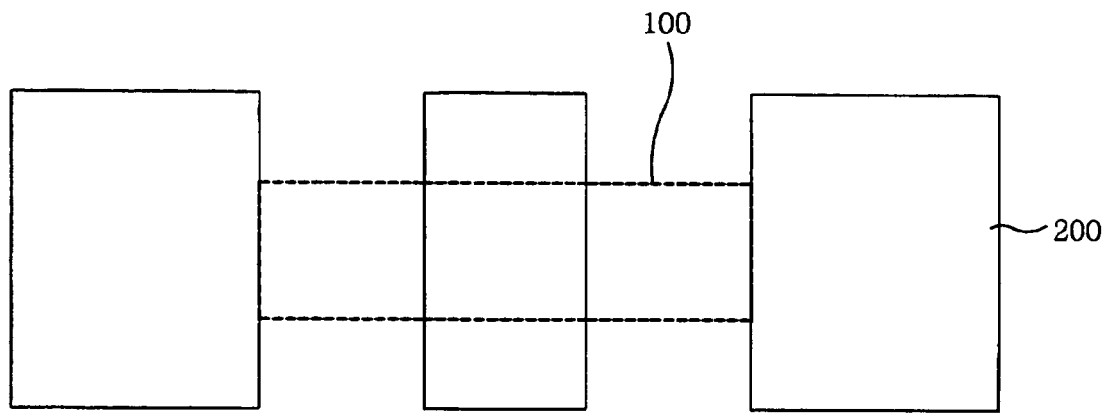
FIG. 1 is a schematic block diagram of an example element isolation mask and an example source/drain mask constructed in accordance with the teachings of the present disclosure.

FIG. 1 is a schematic block diagram of an example element isolation mask 100 and an example source/drain mask 200.

FIGS. 2A to 2E illustrate an example procedure for forming a transistor.

Figure 2A:
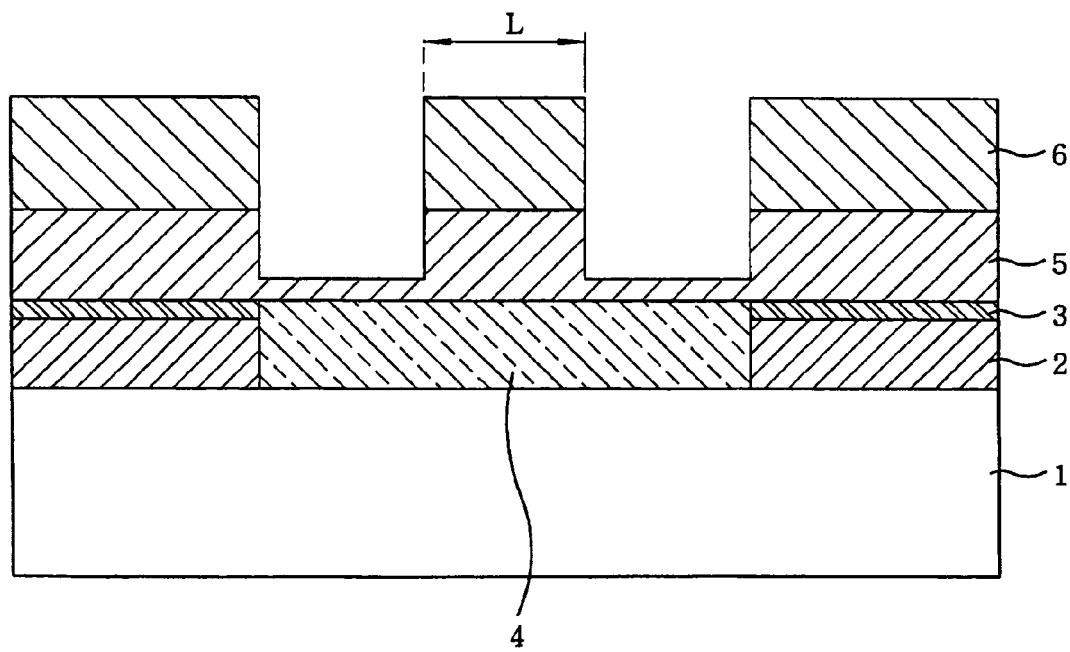
FIGS. 2A to 2E are cross-sectional views illustrating an example procedure for forming a transistor in accordance with the teachings of the present disclosure.

Referring to FIG. 2A, an element isolation oxide layer, e.g. a shallow trench isolation (STI) 2 is thermally grown on a silicon substrate 1 to an isolation depth. A first nitride layer 3 is then deposited on the element isolation oxide layer 2. A first photoresist (not shown) is then patterned using the element isolation mask 100. The first nitride layer 3 and the element isolation oxide layer 2 are sequentially etched by an anisotropic dry etching process to thereby expose the silicon substrate 1 in a portion where an active region is formed. Thereafter, the first photoresist is removed and a cleaning process for the silicon substrate 1 is performed. Next, an epitaxial active region 4 is epitaxially grown on the silicon substrate 1. A first oxide layer 5 is then deposited on the epitaxial active region 4 to a thickness of a gate electrode to be formed later. A second photoresist 6 is patterned using the source/drain mask 200. The first oxide layer 5 is then etched by the anisotropic dry etching process. At this time, the first oxide layer 5 is not entirely removed and remains with a predetermined thickness. In FIG. 2A, L is a width between a source and a drain so that L is a channel length of the gate electrode to be formed later.

Figure 2B:
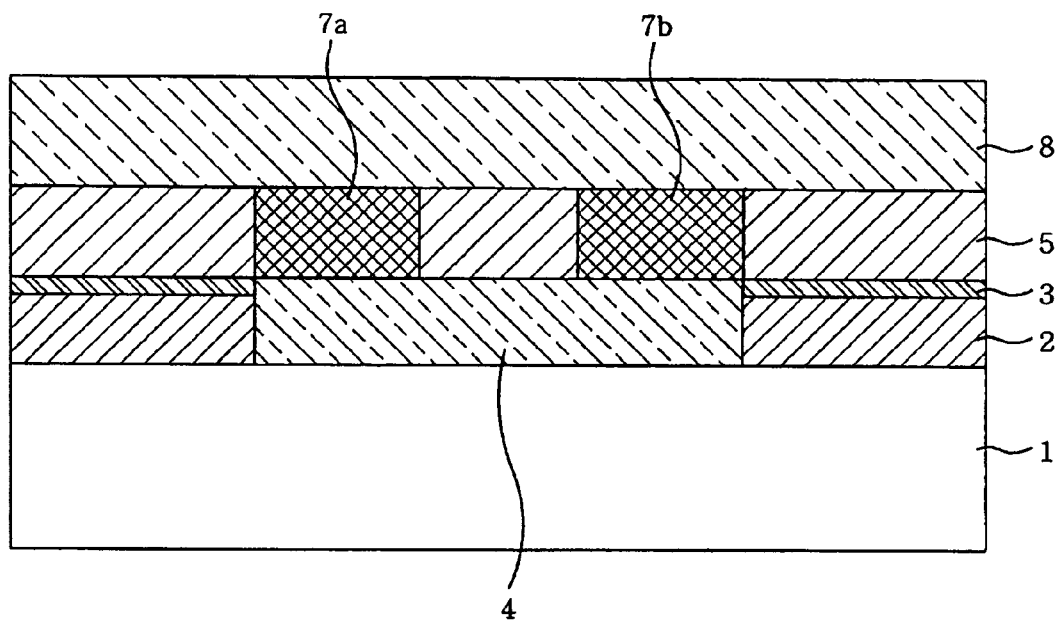

Referring now to FIG. 2B, the photoresist 6 is removed. Next, the remaining first oxide layer 5 located on portions of the source/drain 7a and 7b to be formed later is removed using a diluted hydrofluorine (HF) solution so that the source/drain 7a and 7b can be formed by a doped epitaxial growth and the channel length of a gate to be formed later can also be controlled. Thereafter, the source 7a and the drain 7b are doped-epitaxially grown. A second nitride layer 8 whose thickness is not less than that of the first oxide layer 5 is deposited.

Figure 2C:
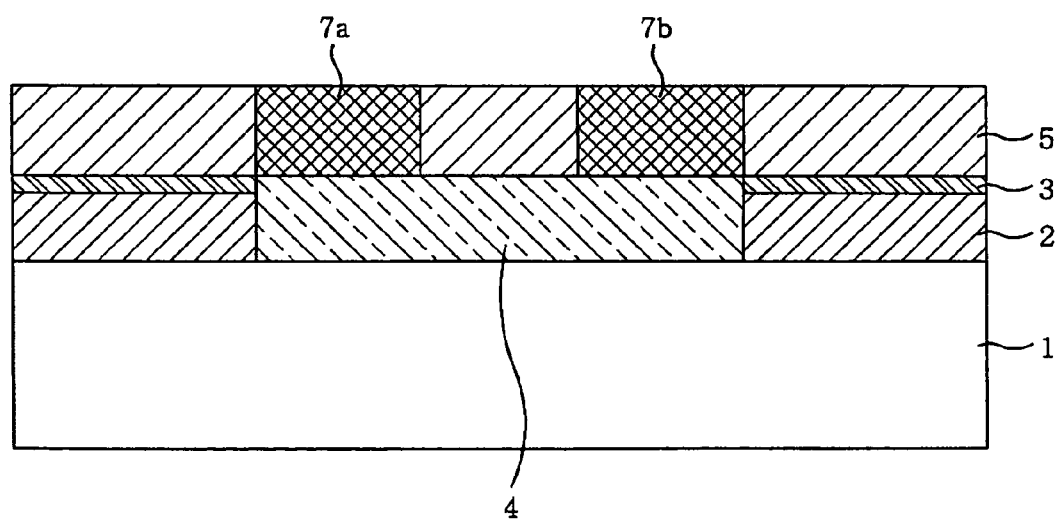
Figure 2D:
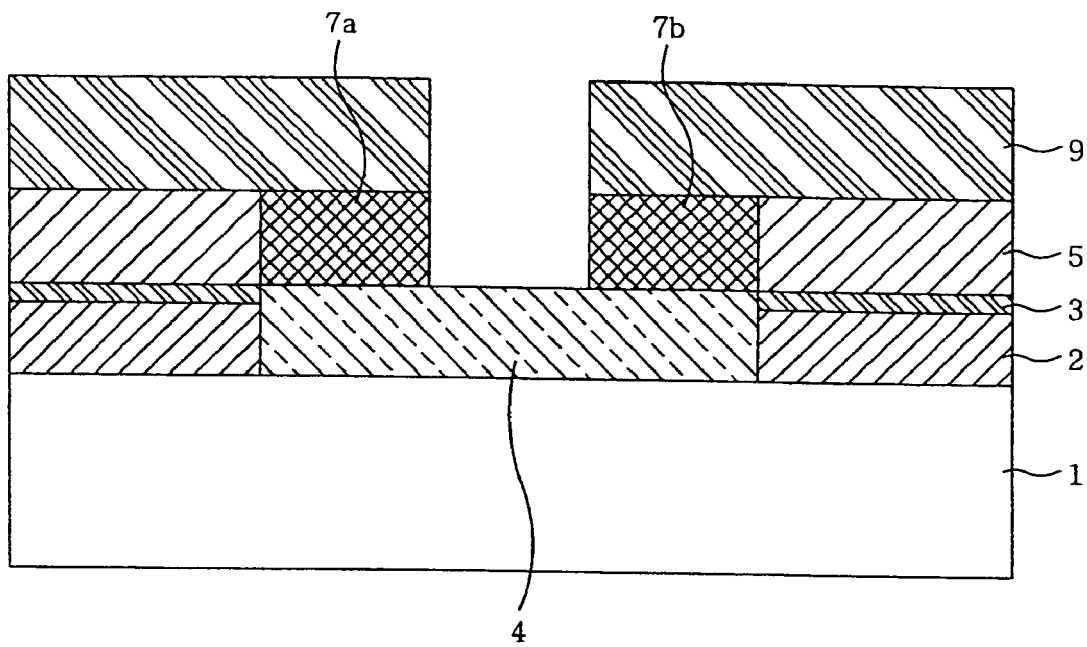

Referring to FIG. 2C, the second nitride layer 8 is planarized using a chemical mechanical polishing (CMP) method.

Figure 3:
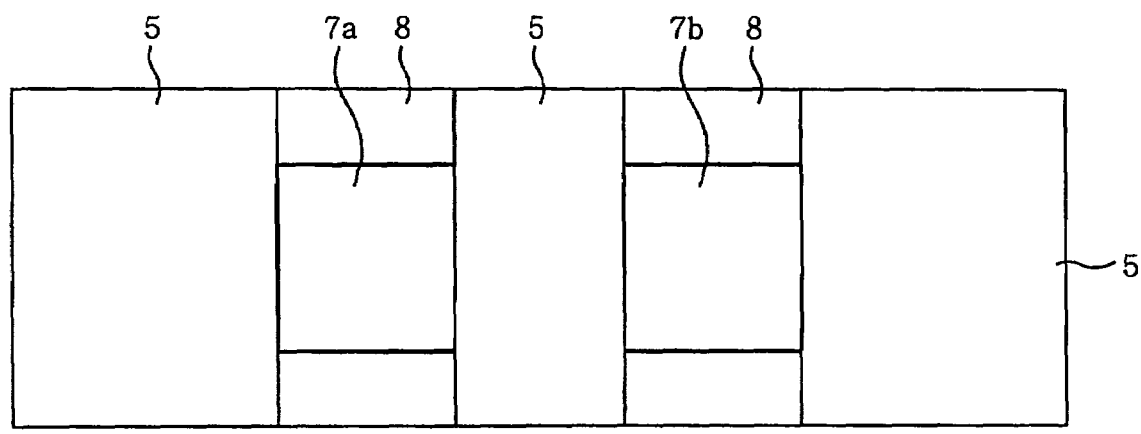
FIG. 3 is a plan view of the silicon substrate after planarizing the second nitride.

FIG. 3 depicts a plan view of the example silicon substrate after planarizing the second nitride layer 8. As can be seen from FIG. 3, the source/drain active regions 7a and 7b are separated from each other by means of the planarized second nitride layer 8.

Figure 4:
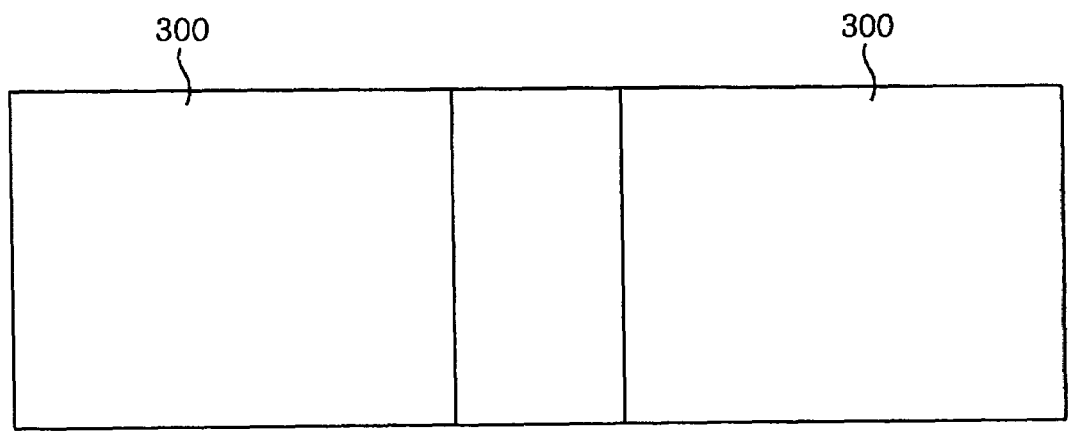
FIG. 4 is a schematic block diagram of an example gate electrode mask constructed in accordance with the teachings of the present disclosure.

FIG. 4 is a schematic block diagram of an example gate electrode mask 300.

Referring back to FIG. 2D, a third photoresist 9 is pattered by using the gate electrode mask 300. The exposed first oxide layer 5 is etched away using a wet etching etchant to thereby expose the active region 4.

Figure 2E:
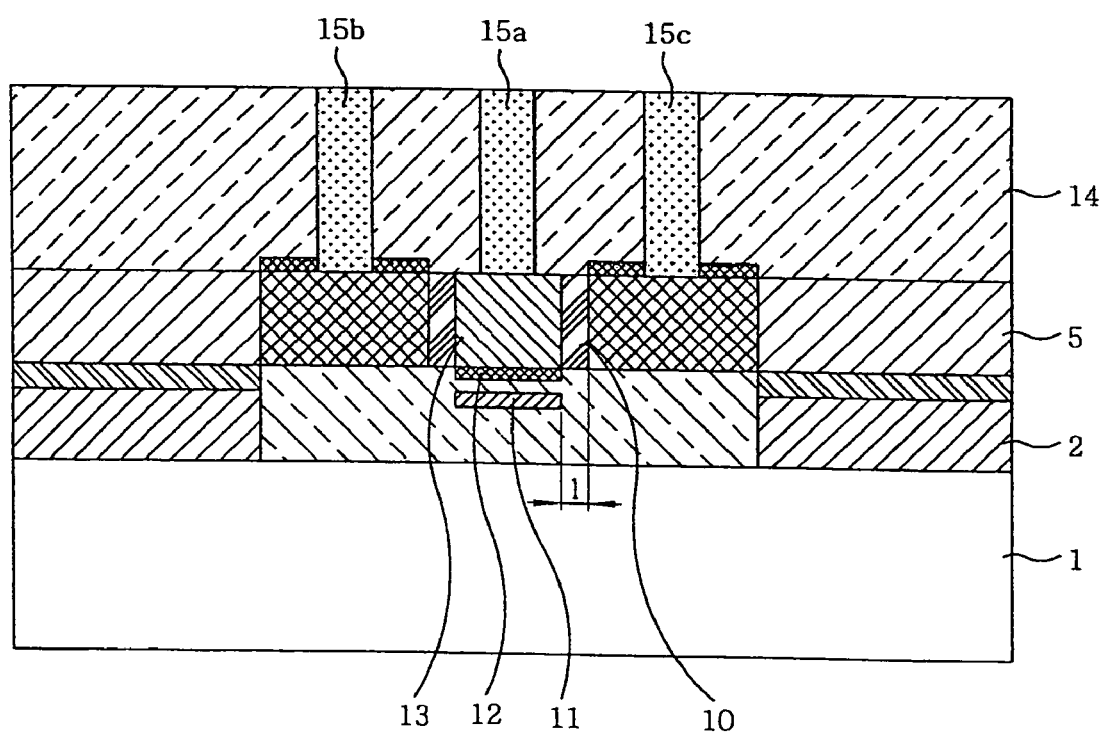

Referring to FIG. 2E, the third photoresist 9 is removed. Then a third nitride layer 10 is deposited on the overall surface and etched back. By doing this, the third nitride layer 10 for use in controlling the length of the gate remains at a predetermined thickness, e.g., 1. Next, a local channel 11 is ion-implanted. Then a gate insulation layer 12 and a gate electrode 13 are sequentially deposited on the active region 4. Thereafter, the gate electrode 13 is planarized. A second oxide layer 14 is then thickly deposited. A gate electrode plug 15a, a source electrode plug 15b and a drain electrode plug 15c are then formed.

From the foregoing, persons of ordinary skill in the art will appreciate that a gate having a fine pattern can be formed by using the third nitride layer 10 to control the channel length of the gate. Thus, new methods capable of enhancing an operating characteristic of a transistor and reducing a cost of a lithography tool are provided.

From the foregoing, persons of ordinary skill in the art will further appreciate that the above disclosed methods and apparatus provide a transistor capable of enhancing an operating characteristic thereof by depositing a nitride layer for controlling a length of a gate channel in a formation of a gate thereby reducing the cost of a lithography tool. An example method for fabricating a semiconductor device, comprises: (a) depositing an isolation oxide layer and a first nitride layer on a semiconductor substrate; (b) forming a trench in an active region by etching the first nitride layer and a portion of the semiconductor substrate; (c) performing an epitaxial growth on the active region and depositing a first oxide layer thereon; (d) etching portions of the first oxide layer where a source and a drain are to be formed by using a source/drain mask, wherein the etched first oxide layer has a predetermined thickness; (e) etching the first oxide layer deposited on the portions where the source and the drain are to be formed, performing an epitaxial growth on the portions where the source and the drain are to be formed to thereby form the source and the drain, and depositing a second nitride layer thereon; (f) etching the first oxide layer in a portion where a gate is to be formed using a gate mask; (g) depositing and planarizing a third nitride layer on the source, the drain, and the exposed active region to thereby form a nitride layer for use in controlling a length of the gate; (h) sequentially depositing a gate isolation layer and a gate electrode on the active region; and (i) depositing a dielectric layer on the resultant structure, and forming plugs on the source, drain, and gate respectively.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a semiconductor device comprising:

depositing an isolation oxide layer and a first nitride layer on a semiconductor substrate;

forming a trench in an active region by etching a portion of the first nitride layer and a portion of the isolation oxide layer to thereby expose the semiconductor substrate in the active region;

growing an epitaxial layer on the active region and depositing a first oxide layer on the epitaxial layer;

using a source/drain mask, etching a first portion of the first oxide layer such that a second portion of the first oxide layer having a predetermined thickness remains where a source and a drain are to be formed;

removing the second portion of the first oxide layer where the source and the drain are to be formed and performing an epitaxial growth on the portions where the source and the drain are to be formed to thereby form the source and the drain;

using a gate mask, etching a portion of the first oxide layer where a gate is to be formed;

depositing a second nitride layer on the source, the drain and the exposed active region, and etching back the second nitride layer to thereby form a nitride layer to control a length of the gate;

sequentially depositing a gate insulation layer and a gate electrode on the active region; and depositing a second oxide layer; and forming plugs on the source, the drain and the gate.

2. A method as defined in claim 1, wherein depositing the isolation oxide layer comprises depositing a shallow trench isolation(STI).

3. A method as defined in claim 1, wherein the first oxide layer is deposited to a thickness approximately equal to a thickness of the gate electrode.

4. A method as defined in claim 1, wherein removing the second portion of the first oxide layer where the source and the drain are to be formed comprises removing the second portion of the first oxide layer where the source and the drain are to be formed with a diluted HF solution.

5. A method as defined in claim 1, wherein the first oxide layer is etched by an anisotropic dry etching process.

6. A method as defined in claim 1, wherein depositing the second nitride layer on the source and the drain comprises depositing the second nitride layer to a thickness not less than the thickness of the first oxide layer.

* * * * *